United States Patent [19]
Turner

[11] Patent Number: 6,064,191
[45] Date of Patent: May 16, 2000

[54] CURRENT TRANSDUCER AND CURRENT-MONITORING METHOD

[75] Inventor: Michael James Turner, Leeds, United Kingdom

[73] Assignee: Switched Reluctance Drives Limited, Harrogate, United Kingdom

[21] Appl. No.: 08/904,003

[22] Filed: Jul. 31, 1997

[30] Foreign Application Priority Data

Aug. 1, 1996 [GB] United Kingdom .................. 9616157

[51] Int. Cl.$^7$ .......................... G01R 1/14; H02K 23/00;
G05B 1/06; H02P 1/46
[52] U.S. Cl. ......................... 324/127; 318/254; 318/656;
318/701
[58] Field of Search .......................... 324/127; 318/701,
318/702, 656, 254

[56] References Cited

U.S. PATENT DOCUMENTS

| | | | |
|---|---|---|---|
| 3,568,052 | 3/1971 | Anderson | 324/253 |
| 4,454,557 | 6/1984 | Hurley | 324/127 |
| 4,616,176 | 10/1986 | Mercure et al. | 324/127 |
| 4,794,326 | 12/1988 | Friedl | 324/127 |
| 4,980,794 | 12/1990 | Engel | 324/127 |
| 5,015,945 | 5/1991 | Randun | 324/127 |
| 5,043,643 | 8/1991 | Hedlund et al. | 318/701 |
| 5,298,857 | 3/1994 | Voisine et al. | 324/142 |
| 5,367,240 | 11/1994 | Schröder-Brumloop et al. | 318/727 |
| 5,467,025 | 11/1995 | Ray | 318/701 |
| 5,563,488 | 10/1996 | Stephenson et al. | 318/701 |
| 5,627,445 | 5/1997 | Webster | 318/701 |
| 5,821,648 | 10/1998 | Allinson | 318/68 B |
| 5,886,521 | 3/1999 | Hassan | 324/227 |

FOREIGN PATENT DOCUMENTS 2 034 487  6/1980  United Kingdom .
2 259 150  3/1993  United Kingdom .

OTHER PUBLICATIONS

Ray, W.F., et al., "Sensorless Methods for Determining the Rotor Position of Switched Reluctance Motors," Proceedings of European Power Electronics EPE '93 Conference, Brighton, UK, pp. 7–13, Sep. 1993.

Slemon, G.R., "Electric Machines," Addison–Wesley Publishing Company, USA, pp. 91–97, 158–159, 1980.

Stephenson, Dr. J.M., "The Characteristics, Design and Applications of Switched Reluctance Motors and Drives," Presented at the PCIM '93 Conference and Exhibition at Nürnberg, Germany, pp. 1–68, Jun. 21–24, 1993.

Renco Electronics, RL 3410, RRL3420, RL3430 brochure, pp. 30–31, prior to Aug. 10, 1996.

LEM Module LA 200–S brochure, 2 pp., prior to Aug. 10, 1996.

Primary Examiner—Josie Ballato
Assistant Examiner—Jermele M. Hollington
Attorney, Agent, or Firm—Patterson & Keough, P.A.

[57] ABSTRACT

A current transducer includes a current transformer in which the conductor carrying the current to be monitored constitutes the primary. The transformer secondary is wound on a toroidal core. The transformer is operated below its cut-off frequency such that the output from the secondary is proportional to the differential of the current in the primary. The secondary output is integrated by an integrator to provide a measure of current in the primary and the integrator is initialized at predetermined intervals. A current measuring device for an electric machine, for example a reluctance machine, includes at least one of the current transducers.

11 Claims, 5 Drawing Sheets

CURRENT TRANSDUCER AND CURRENT-MONITORING METHOD

BACKGROUND OF THE INVENTION

1. Field of the Invention

This invention relates to current transducers.

2. Description of Related Art

Current transformers (CT's) are a form of transducer by which a measure of a current in a conductor can be derived. They are electrically isolated from the conductor itself and, for this reason, they have found extensive use in fault protection systems and in the field of power electronics as, for example, monitors for current regulation.

A known CT relies on the substantial balance of magnetomotive forces (MMF) between primary and secondary windings that will exist in a CT using a high permeability core. FIG. 1 shows a simple CT with primary current $I_p$ secondary current $I_s$, load or 'burden' resistance $R_L$, secondary winding resistance $r_s$ and a core of reluctance $\mathcal{R}$. A low secondary circuit impedance ('burden') will mean that the balanced condition will be achieved at relatively low levels of core flux. This means that relatively little MMF is required to support the core flux, and that, therefore, the net ampere-turn product, taking both the primary and secondary circuits into account, will be close to zero. This means that:

$$n_p I_p + n_s I_s = 0 \text{ (approximately)}$$

and therefore:

$$I_S = -\frac{n_p}{n_s} I_P \text{ (approximately)}$$

In practice, $n_p$ will usually be small and the primary may often comprise one or more turns of an external conductor passed through a circular or square core upon which many turns of secondary are wound.

Current transformers of this type are well-known and understood, and are in common use for alternating current measurement. They are discussed in, e.g., the book *'Electrical Machines'* by Slemon & Straughan, Addison Wesley, USA, 1980, which is incorporated herein by reference.

Frequency-domain analysis of the simple CT model shown in FIG. 1 shows that the frequency response is as shown in FIG. 2 when $I_p$ is supplied from a sinusoidal alternating current source. As can be seen, the response is accurate only where the frequency is well above the "cut-off" value $\omega_c$. Below $\omega_c$, the response falls with decreasing frequency, and $I_s$ will ultimately be zero where $I_p$ is of zero frequency—i.e. there will be zero response to a constant, direct, current.

The fall in response for frequencies below $\omega_c$ may be understood by considering the core flux, which (given $r_s + R_L$ is non-zero) will be proportional to the integral of the secondary voltage. In the case of an alternating waveform the amplitude of the core flux will be inversely proportional to the frequency of the monitored current. In addition, the finite permeability of a real core requires MMF to drive the flux around the core. Assuming a linear response of the magnetic material of the core, this MMF will be directly proportional to the flux. As the core flux increases a larger MMF will be needed to support it. Thus, with decreasing frequency the CT core absorbs an increasing proportion of the primary MMF. Therefore, the secondary MMF and the output current must fall.

It has been considered that a tail-off in the lower frequency response of a CT presents an operating limit on its usefulness. A low frequency CT needs both a large core and a low secondary impedance to offer a flat frequency response over a specified working frequency range. In the limit, known CTs cannot operate at dc (zero frequency) because of the non-zero secondary circuit resistance and non-zero core reluctance which are present in practice.

GB 2034487A, which is incorporated herein by reference, discloses a current transformer where the secondary winding is connected to an operational amplifier configured as an integrator. Although this system allows some degree of compensation for changes in temperature of the current transformer, it still cannot extend the frequency response down to zero frequency.

To address the problem of measuring currents at low frequencies and at dc, current measuring devices have been developed that rely on the Hall-effect. These are responsive to the strength of the magnetic field created by the current to be monitored. They are also often referred to in the art as current transformers' although conventional transformer principles are not involved.

A known current transducer based on the Hall-effect uses a Hall-effect device arranged in a gap of a toroidal core. The conductor carrying the current to be monitored is arranged to pass through the toroid. The Hall-effect element measures directly the flux resulting from the introduction of MMF in the toroidal core due to the current in the conductor.

While the device is relatively simply constructed, it has some disadvantages. Firstly, the response of the core material is not linear, which results in a non-linear relationship between primary current and core flux, and hence an error in the output. Secondly, the Hall-effect device itself also has a non-linear response and displays dc offset characteristics which will introduce error into measurements. Furthermore, the small amplitude of the Hall voltage output requires relatively large gain amplification which may render the transducer unacceptably prone to noise.

Feedback has been used in conjunction with a CT and a Hall-effect element. In this arrangement the drawbacks associated with a conventional CT are addressed by actively driving the secondary current from an amplifier having an input which is a negative feedback signal from the Hall-effect element proportional to core flux. The secondary MMF is then independent of burden voltage and can be made to follow the MMF due to the current in the primary conductor as closely as necessary by adjusting the product of the gain of the feedback amplifier and core permeability. With very large amplifier gain (and high core permeability) the balance between the primary and secondary MMFs is determined only by the offset null of the Hall-effect device. Core linearity becomes largely irrelevant because the feedback action is always such as to maintain zero flux. The ratio of primary to secondary current is, therefore, determined by the ratio of primary to secondary turns only.

Such current transducers of the 'flux nulling' Hall-effect type have become popular in the electric machine control field (for example for switched reluctance motors and generators) because of their dc response, wide bandwidth and small size. An example of the flux-nulling sensor is one manufactured by LEM s.a. of Geneva, Switzerland. These sensors are non-invasive and electrically isolated from the monitored current. However, they are relatively expensive because they need an accurately zeroed Hall-effect element and fast responding amplifiers. Furthermore, the core can still take up a significant amount of space.

SUMMARY OF THE INVENTION

It is an object of the present invention to provide a current transducer that is simple to construct, and can be small in size and operated down to zero frequency.

According to one embodiment of the present invention, there is provided a current transducer comprising an electromagnetic sensor for arrangement in a sensing relationship with a conductor to be monitored for current, the sensor having a frequency response characteristic which includes a cut-off frequency below which the output of the sensor is substantially proportional to the differential of the monitored current with respect to time, and an integrator having an input connected to receive the output of the sensor and an output indicative of the current in the conductor, the transducer further comprising means for initializing the integrator which means are operable to set the integrator output to a predetermined value prior to monitoring the current.

To take account of drift in the integrator, it may be resettable to a predetermined output. Preferably, the sensor is a current transformer, and the current transformer includes a coiled member, constituting the secondary winding. It may also be wound on a magnetizable core or could be arranged with an air core. The core may be toroidal in shape.

An embodiment of the invention also extends to a method of monitoring current in a conductor comprising:

arranging an electromagnetic sensor in a sensing relationship with a conductor to be monitored for current, the frequency of the current being less than the cut-off frequency of the sensor, such that the output of the sensor is a differential of the current in the conductor;

setting the integrator to a predetermined value prior to monitoring the current; and integrating the output of the sensor to derive a signal indicative of the current in the conductor.

According to this method, the integrator is preferably initialized to some predetermined value before monitoring the current in a conductor. Initialization may be effected when the current in the conductor reaches a predetermined magnitude, for example zero.

In another embodiment the invention also extends to a current measuring device for an electric machine comprising a transducer as defined above and control means connected with the initializing input of the integrator, the control means being operable to initialize the output of the integrator to the predetermined value prior to measuring the current.

An example of such a machine is a reluctance machine having a rotor, a stator and one or more phase windings, the sensor being arranged in relation to the or each phase winding and in which the control means include means for producing a signal indicative of the position of the rotor with respect to the stator in a phase inductance cycle, which control means are arranged to initialize the integrator at a predetermined point in the phase inductance cycle.

BRIEF DESCRIPTION OF THE DRAWINGS

The present invention can be put into practice in various ways, some of which will now be described by way of example with reference to the accompanying drawings, in which.

DETAILED DESCRIPTION OF PREFERRED EMBODIMENTS

Figure 3:
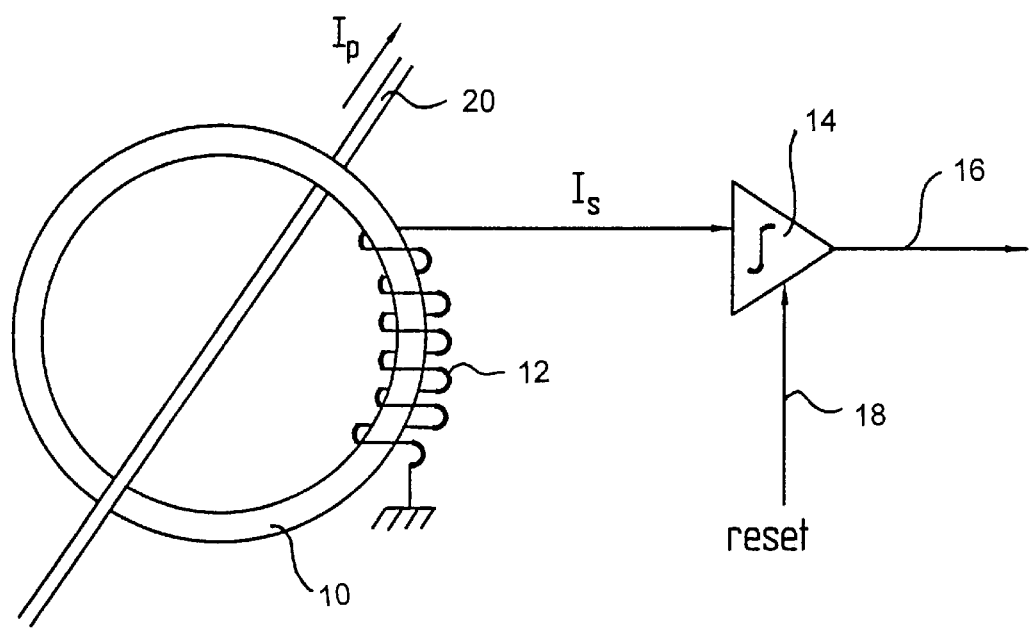
FIG. 3 is a schematic circuit diagram of a current transducer according to an embodiment of the invention.

Referring to FIG. 3, a current transformer comprises a ferrite toroid 10. The toroid 10 serves as a core for a winding 12. One end of the winding is connected with an input to an integrator 14. The opposite end of the winding 12 is grounded. A suitable current transformer is a low-cost unit from a range made by RENCO Electronics, Inc, New York, USA, e.g. Model RL3430. The integrator 14 has an output 16 and a resetting input 18.

The integrator 14 can be any construction that will be known to the skilled person. For example, a well known form is based on an operational amplifier which has a capacitor connected across the inverting input and the output. The resetting input is in the form of a switch connected in parallel with the capacitor across the input and output. As an alternative, a digital, as opposed to an analog, integrator may be used, typically implemented in a microcontroller or application specific integrated circuit (ASIC).

As will be clear from FIG. 3, a conductor 20 carrying the current to be measured projects through the toroid 10 and is thereby arranged in electromagnetic relationship with, but electrically isolated from, the winding 12. As with known current transformers, the conductor 20 constitutes the primary and the winding 12 the secondary.

Figure 1:
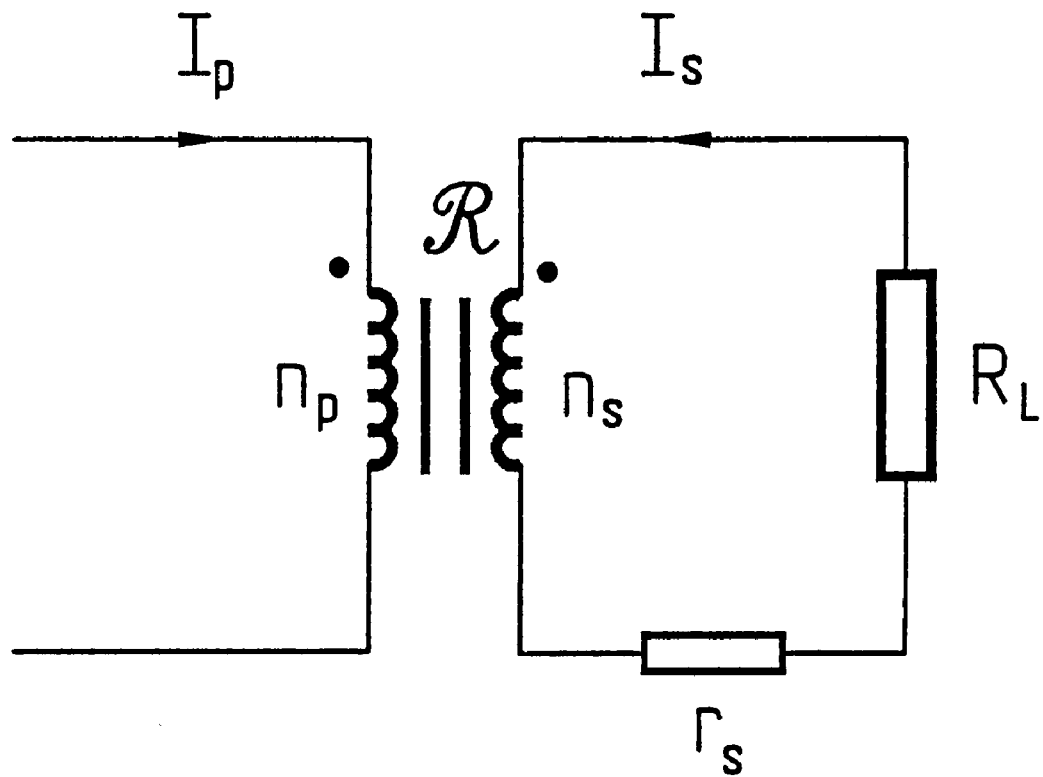
FIG. 1 is a circuit diagram of a known current transformer.
Figure 2:
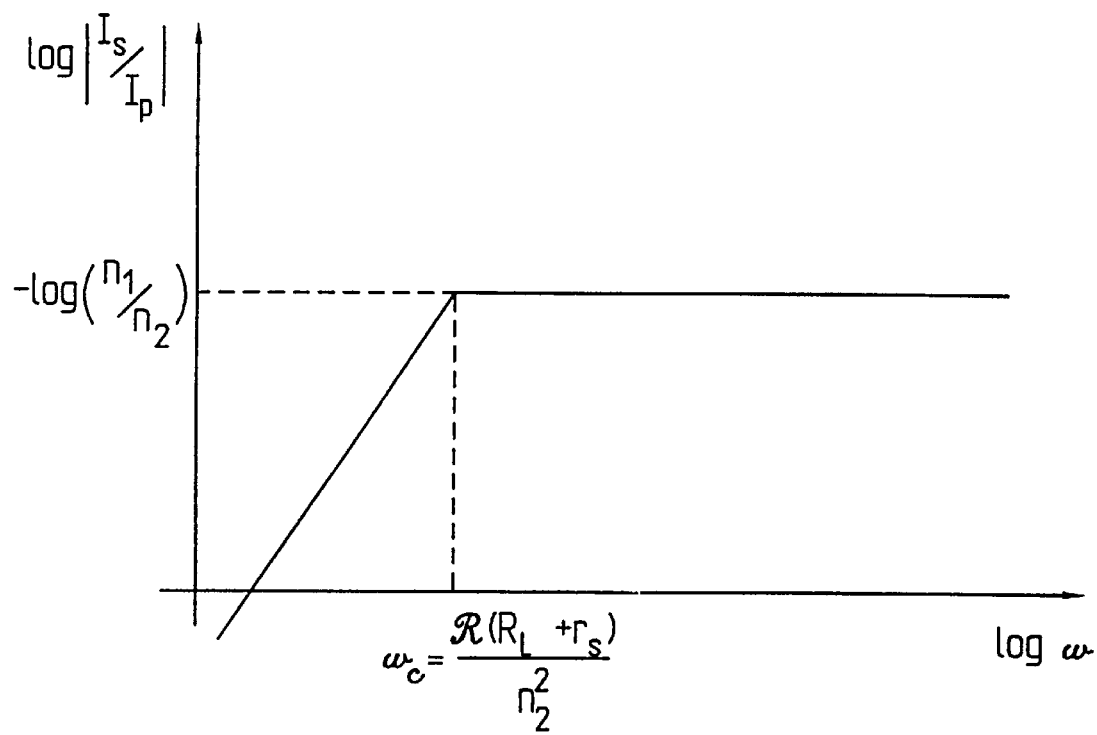
FIG. 2 is a frequency response curve for the current transformer of FIG. 1.

The flux in the toroid 10 created by the current in the conductor 20 induces a current in the winding 12. This will be apparent to the skilled person in accordance with known current transformer theory. As explained above, the frequency response of a current transformer has a lower cut-off frequency which can be represented on a Bode plot as shown in FIG. 2. For the purposes of this description, the 'cut-off frequency' is that at which the frequency response of a device changes (in the case of FIG. 2 falls) by 3dB. The cut-off frequency of a current transformer can be determined empirically or from theory. In the case of a current transformer the generalized formula for the cut-off frequency is:

$$\omega_c = \Re \frac{R_L}{n_2^2}$$

where:

$\omega_c$=cut-off frequency (rad/s)

$\Re$=core reluctance (/H)

$R_L$=load resistance (ohms)

$n_2$=number of winding turns in the secondary

It is well known to operate a CT above the cut-off frequency where the output current of the secondary is proportional to the input current to be measured on the primary and the CT turns ratio.

Up to now it has not been considered practicable to utilize the conventional CT to measure currents which have a zero frequency (dc) component. An integrator allows the response to be extended below the lower cut-off frequency but, in the prior art, cannot extend it to zero frequency because of the indeterminate nature of the integrator's dc offset, which is effectively the mathematical 'constant of integration'. By using embodiments of the present invention, a CT can be used to as low a frequency as necessary, including dc, by integrating the secondary winding current when the measured current frequency in the primary conductor 20 is below the cut-off frequency, and by initializing the integrator to a known value at suitable intervals.

As a practical matter, it is desirable to design a particular current transformer according to the invention so that the expected operational frequency range is sufficiently far below the cut-off frequency to avoid the possibility of a distorted output from the current transformer in the transitional region between the differential region and the conventional proportional region of operation of the CT.

The CT of FIG. 3 is arranged to have a voltage-based output for which the input impedance of the integrator is preferably high, as is the case in an operational amplifier. Alternatively, the high impedance could be constituted by a buffer amplifier. A high load impedance is to be preferred, since it ensures that the cut-off frequency $\omega_c$ is high.

It will be apparent to the skilled person that the output from the CT could be current-based, but again the impedance 'seen' by the CT is desirably sufficiently high to swamp the winding resistance, and the operating range is preferably well away from the cut-off frequency of the CT.

Figure 4:
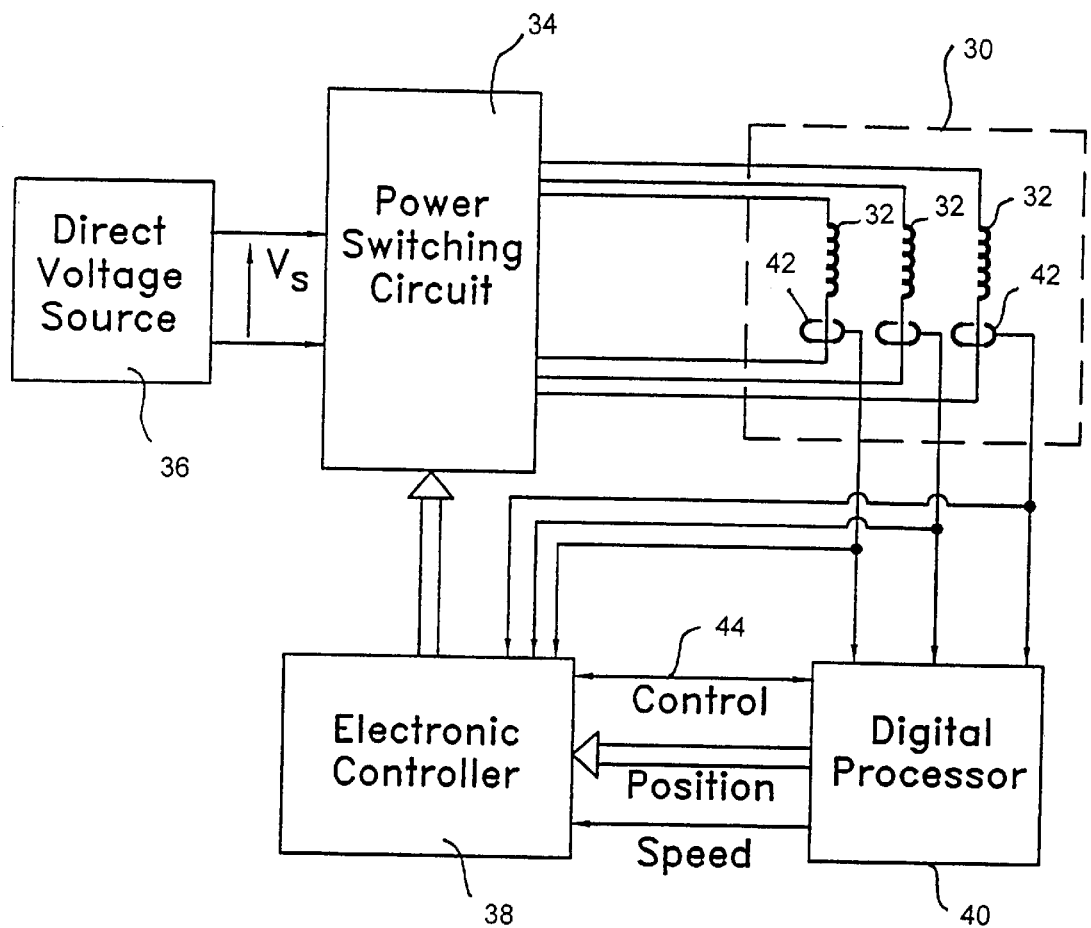
FIG. 4 is a schematic diagram of a reluctance machine incorporating the transducer of FIG. 3.

FIG. 4 illustrates an implementation of the invention in a switched reluctance machine. The machine can be run as a motor or a generator. A switched reluctance machine 30 has one or more phase windings 32 which are energized by means of a power switching circuit 34 containing semiconductor switches and drawing power from (or returning power to) a direct voltage source 36. The direct voltage source 36 may be obtained from a battery or by rectifying an ac mains supply. The semiconductor switches are turned on and off, depending on the rotor position, according to known control strategies by an electronic controller 38. To execute these strategies the electronic controller requires information on the phase currents and the rotor position and speed. These techniques are well known and discussed in, e.g., 'The Characteristics, Design and Applications of Switched Reluctance Motors and Drives' by Stephenson and Blake, PCIM '93 Conference, Nurnberg, 1993, which is incorporated herein by reference.

The rotor position and speed may be derived from a known rotor position transducer or from the dynamic characteristics of the machine in operation. The skilled person will be aware that various techniques exist for producing signals indicative of rotor position relative to the stator and rotor speed. A review of such methods is given in 'Sensorless methods for determining the rotor position of switched reluctance motors' by Ray and Al-Bahadly, Proceedings of European Power Electronics EPE'93 Conference, Brighton, UK, September. 1993.

In the embodiment in FIG. 4 the means necessary for determining rotor position comprise a digital processor 40 and current transducers 42 as shown in FIG. 3 for providing the digital processor 40 with a measurement of the phase current in each winding 32. Each of the transducers is the equivalent of the core and coil arrangement 12/10 in FIG. 3. The integrators in this embodiment are contained within the digital processor 40. The current measurement signals are also provided to the electronic controller. Although, for the convenience of illustration, FIG. 4 shows the current transducers 42 in the box representing the machine 30, in practice these transducers could be contained in the power switching circuit 34 so as to minimize the number of connections to the machine.

Figure 5A:
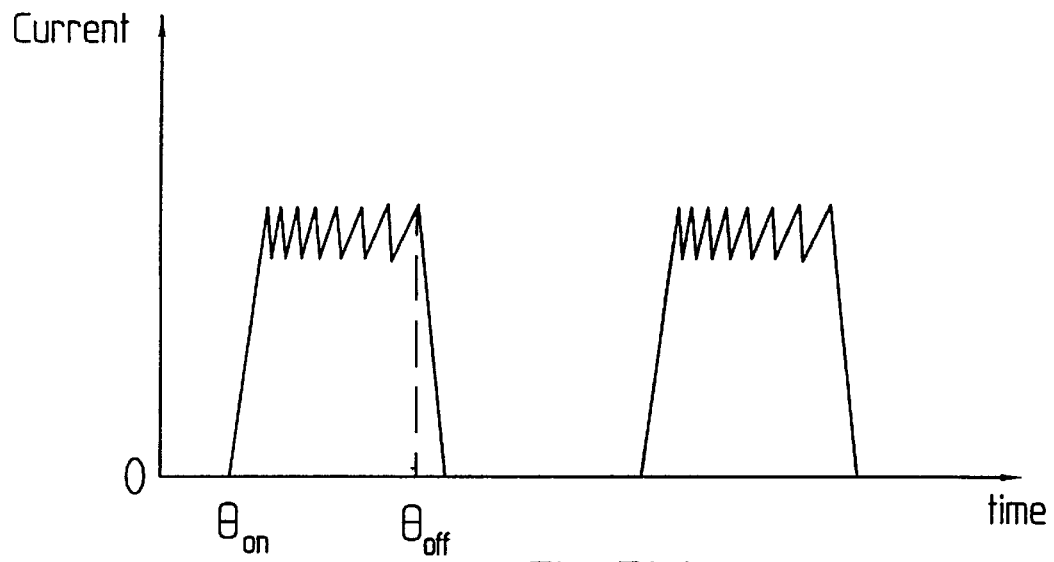
FIGS. 5(a) and (b) are phase current waveforms for the machine of FIG. 4.

A control signal interface 44 connects the electronic controller with the digital processor and the control signals for initiating and resetting the integrators 14 pass from the digital processor 40. The digital processor 40 may also include analog to digital converters to convert the measured values into digital form if necessary. FIGS. 5(a) and (b) respectively illustrate the notional waveforms of phase current for one of the phases in the lower speed 'chop' mode of operation of the switched reluctance machine and the higher speed 'single pulse' mode of operation. The skilled person will be familiar with these modes and they will not be described further here. In both cases, it will be seen that each phase cycle includes a period of zero current between the conduction which is delimited by $\theta_{on}$ and $\theta_{off}$. The present invention usefully exploits this regular period of known current value (i.e. zero) by initializing the integrator before each conduction period in which the phase current is to be measured.

Figure 5B:
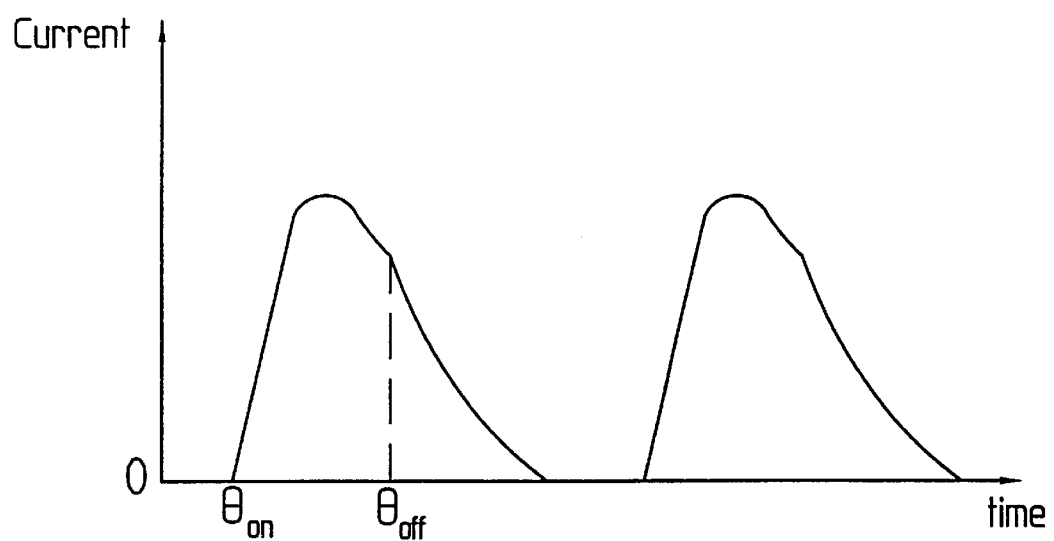

While FIGS. 3 and 5 have been used to describe the invention in terms of initializing to a zero current level, it will be apparent to the skilled person that any current value could be used to which the integrator is initialized, provided that the integrator output is compensated for non-zero levels.

Another form of current sensor that could be used is the Rogowski coil disclosed in GB 2259150A, which is incorporated herein by reference. In this case, the low frequency response (i.e. that below the cut-off frequency) is also such that the output voltage or current is proportional to the differential of the conductor current to be measured with respect to time.

While the invention has been described in connection with the illustrative embodiments discussed above, those skilled in the art will recognize that many variations may be made without departing from the present invention. Accordingly, the above description of several embodiments is made by way of example and not for the purposes of limitation. The present invention is intended to be limited only by the scope of the following claims.

What is claimed is:

1. A current transducer comprising an electromagnetic sensor, including a coiled member wound on a magnetizable core, for arrangement in a sensing relationship with a conductor to be monitored for current, the sensor having a frequency response characteristic which includes a cut-off frequency below which the output of the sensor is substantially proportional to a differential of the monitored current with respect to time, and an integrator having an input connected to receive the output of the sensor and an output indicative of the current in the conductor, the transducer further comprising means for initializing the integrator which means are operable to set the integrator output to a predetermined value prior to monitoring the current.

2. A transducer as claimed in claim 1 in which the core is toroidal.

3. A method of monitoring current in a conductor comprising:

arranging an electromagnetic sensor, including a coiled member wound on a magnetizable core, in a sensing relationship with a conductor to be monitored for current, the frequency of the current being less than a cut-off frequency of the sensor, such that the output of the sensor is a differential of the current in the conductor;

setting an integrator to a predetermined value prior to monitoring the current; and integrating the output of the sensor with the integrator to derive a signal indicative of the current in the conductor.

4. A method as claimed in claim 3 in which the predetermined value is zero.

5. A current measuring device for an electric machine comprising a transducer as claimed in claim 1, further comprising control means, connected with a initializing input of the integrator, for initializing the output of the integrator to the predetermined value prior to measuring the current.

6. A device as claimed in claim 5 in which the machine is a reluctance machine having one or more phase windings, the sensor being arranged in relation to the or each phase winding, and in which the control means includes means for producing a signal indicative of rotor position in a phase inductance cycle, which control means are arranged to initialize the integrator at a predetermined point in the phase inductance cycle.

7. A device as claimed in claim 6 in which the said point corresponds to zero phase current.

8. A current transducer comprising an electromagnetic sensor, including a coiled member wound on a magnetizable core, for arrangement in a sensing relationship with a conductor to be monitored for current, the sensor having a frequency response characteristic which includes a cut-off frequency below which the output of the sensor is substantially proportional to a differential of the monitored current with respect to time, and an integrator having an input connected to receive the output of the sensor and an output indicative of the current in the conductor, the integrator output being settable to a predetermined value prior to monitoring the current.

9. A transducer as claimed in claim 8 in which the predetermined value is zero.

10. A current measuring device for an electric machine comprising a transducer as claimed in claim 8, further comprising a controller connected with the integrator for initializing the output of the integrator to the predetermined value prior to measuring the current.

11. A device as claimed in claim 10 in which the machine is a reluctance machine having one or more phase windings, the sensor being arranged in relation to the or each phase winding, and in which the controller produces a signal indicative of rotor position in a phase inductance cycle, the controller being arranged to initialize the integrator at a predetermined point in the phase inductance cycle.

* * * * *